United States Patent
Mori

(10) Patent No.: US 8,926,376 B2
(45) Date of Patent: Jan. 6, 2015

(54) CONTACT TERMINAL HAVING A PLUNGER PIN

(75) Inventor: Shuhi Mori, Tokyo (JP)

(73) Assignee: Shimano Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 13/878,280

(22) PCT Filed: Jun. 13, 2012

(86) PCT No.: PCT/JP2012/065099
§ 371 (c)(1),
(2), (4) Date: Apr. 8, 2013

(87) PCT Pub. No.: WO2013/035399
PCT Pub. Date: Mar. 14, 2013

(65) Prior Publication Data
US 2013/0203300 A1    Aug. 8, 2013

(30) Foreign Application Priority Data

Sep. 5, 2011  (JP) .................. 2011-192407
Dec. 13, 2011 (JP) .................. 2011-271985

(51) Int. Cl.
*H01R 13/24* (2006.01)
*G01R 1/067* (2006.01)

(52) U.S. Cl.
CPC ........ *H01R 13/2421* (2013.01); *G01R 1/06722* (2013.01)
USPC ............................ 439/700; 439/482; 439/824

(58) Field of Classification Search
CPC . H01R 13/2421; H01R 13/2428; H01R 11/18

USPC .................. 439/786, 700, 824, 482
See application file for complete search history.

(56) References Cited

U.S. PATENT DOCUMENTS

| | | | |
|---|---|---|---|
| 4,397,519 A * | 8/1983 | Cooney .................. | 439/824 |
| 6,685,492 B2 * | 2/2004 | Winter et al. ............ | 439/219 |
| 6,696,850 B1 * | 2/2004 | Sanders .................. | 324/755.05 |
| 7,507,110 B1 * | 3/2009 | Yin et al. ................ | 439/482 |
| 7,798,867 B2 * | 9/2010 | Sanders .................. | 439/700 |
| 7,955,140 B1 * | 6/2011 | Lin et al. ................ | 439/700 |
| 2003/0124895 A1 * | 7/2003 | Winter et al. ............ | 439/219 |
| 2010/0248558 A1 * | 9/2010 | Yin et al. ................ | 439/824 |
| 2013/0095690 A1 * | 4/2013 | Kim et al. ............... | 439/370 |
| 2013/0330983 A1 * | 12/2013 | DiFonzo et al. .......... | 439/819 |

FOREIGN PATENT DOCUMENTS

| | | |
|---|---|---|
| JP | 54-129750 A | 9/1979 |
| JP | 59-7571 U | 1/1984 |

(Continued)

*Primary Examiner* — Hae Moon Hyeon
(74) *Attorney, Agent, or Firm* — Birch, Stewart, Kolasch & Birch, LLP

(57) ABSTRACT

A contact terminal having a main body case and a plunger pin received in an elongate hole formed in the main body case is provided. The plunger pin is a round bar provided with a step and includes a small diameter portion including the protrusion end portion and a large diameter portion that slides on a surface of the hole to freely move in a longitudinal direction thereof. A cut space is formed to extend from an end of the large diameter portion so as to leave at least a part of a side surface portion of the large diameter portion and the cut space receives an insulation ball including at least an insulation surface. A coil spring is arranged between the hole and the insulation ball to press the protrusion end portion of the plunger pin such that the protrusion end portion protrudes from the main body case.

6 Claims, 3 Drawing Sheets

(56) References Cited

FOREIGN PATENT DOCUMENTS

| JP | 63-25467 U | 2/1988 |
| JP | 05-043076 U | 6/1993 |
| JP | 6-61321 A | 3/1994 |
| JP | 06-168756 A | 6/1994 |
| JP | 7-34375 U | 6/1995 |
| JP | 2002-040049 A | 2/2002 |
| JP | 2004-340597 A | 12/2004 |
| JP | 2006-501475 A | 1/2006 |

* cited by examiner though there are many types of contact terminals, a coil spring is inserted into an elongate hole provided in a metal-made main body case, a plunger pin is then inserted into the elongate hole, and only a front end portion of the plunger pin is maintained to protrude from the main body case. When this front end portion and the main body case are together pressed against a target position (e.g., a contact point or the like of a printed circuit board or the like) for obtaining electrical connection, the plunger pin slides along the elongate hole of the main body to move backward relative to the main body. In other words, while the plunger pin moves toward an inner side of the elongate hole, electrical connection between the contact point and the plunger pin can be made. As a result, a current flows from the contact point or the like via the plunger pin to the main body case.

By the way, when a relatively large current flows from the contact point or the like via the plunger pin to the main body case, if a current flows also in the coil spring, the coil spring can be burned out by heating due to electrical resistance. For example, when a part of a current flows in the coil spring, from a state where turning parts of the compressed coil spring contact with one another at side surfaces thereof, restoring of the coil spring causes the turning parts to be separated from one another to decrease a sectional area of a current path. As a result, electrical resistance rapidly increases, and the spring coil is thereby heated excessively to be burned out. For this reason, a contact terminal provided with a mechanism for preventing a current from flowing in a coil spring has been developed.

For example, Japanese Patent Application Laid-Open Publication No. 1994-61321 discloses a contact probe that is a contact terminal in which a small diameter portion whose diameter is reduced from a plunger pin is provided at a part of the plunger pin along a longitudinal direction thereof, a protrusion of a main body is made to enter a space of the small diameter portion to prevent the plunger from falling out of an elongate hole of the main body, and an insulation ball is arranged between the plunger pin and a coil spring. Since the insulation ball insulates the coil spring from the plunger pin, a current can flow from the plunger pin to a main body case while a current does not flow in the spring coil. Further, an end portion of the plunger pin positioned inside the elongate hole forms an oblique surface thereon. Thereby, the insulation ball can cause the plunger pin to be pressed against the inner surface of the elongate hole of the main body case. Accordingly, a current can reliably flow from the plunger pin to the main body case.

Further, Japanese Utility Model Application Laid-Open Publication No. 1995-34375 discloses a contact probe that is a contact terminal in which a plunger pin that includes a tip end part having a reduced diameter is inserted into an elongate hole of a main body, and a diameter of an opening of the elongate hole is reduced. Thereby, only the tip end part protrudes from the opening. Thus, the plunger pin is prevented from falling out of the elongate hole of the main body case. Furthermore, in this contact terminal, a conductive ball as well as an insulation ball such as the ball disclosed in the first-mentioned publication are arranged between the plunger pin and the coil spring. The insulation ball insulates the coil spring from the plunger pin. Meanwhile, the conductive ball presses the plunger pin against the main body case. Further, the conductive ball functions as a conductive path between the plunger pin and the main body case. With such a configuration, a current does not flow in the coil spring, and a current can reliably flow from the plunger pin to the main body case.

When a diameter (width) of a contact terminal is increased to increase a sectional area of a current path, a current quantity passing a unit area can be decreased. As a result, a quantity of a current flowing in a coil spring can be decreased. However, for an electric device that does not use a connector, and uses a contact terminal, a smaller size of the contact terminal is generally demanded, and terminals and contact points are arranged on a printed circuit board or the like in high density. To make it possible to use a contact terminal so as to satisfy these demands of such various types of devices, it is not desirable to increase a diameter (width) of the contact terminal to increase the sectional area.

The present invention was made in view of the above-described circumstances, and an object of the present invention is to provide a contact terminal that enables a relatively large current to flow therethrough.

SUMMARY OF THE INVENTION

A contact terminal of the present invention includes a main body case, and a plunger pin received in a non-penetrating elongate hole formed in the main body case, the contact terminal being provided for making electrical connection by contacting the protrusion end portion of the plunger pin protruding from the main body case with a target part, wherein the plunger pin is a round bar provided with a step, the round bar includes a small diameter portion including the protrusion end portion, and a large diameter portion that slides on an inner surface of the non-penetrating hole to freely move in a longitudinal direction thereof, a cut space is formed to extend from an end of the large diameter portion in the longitudinal direction thereof so as to leave at least a part of a side surface portion of the large diameter portion, and the cut space receives an insulation ball including at least an insulation surface, and a coil spring is arranged between the non-penetrating hole and the insulation ball to press the protrusion end portion of the plunger pin such that the protrusion end portion protrudes from the main body case.

According to this invention, while a current does not flow in the coil spring that presses the protrusion end portion of the plunger pin such that the protrusion end portion protrudes from the main body case, a current can be made to reliably flow from the plunger pin to the main body case. As a result, a relatively large current can be made to flow in the contact terminal.

In the above-described invention, a second sac hole having a diameter smaller than a diameter of the insulation ball may be formed by cutting in a bottom portion of the non-penetrating hole of the main body case, and the second sac hole may receive a part of the coil spring at and near an end portion of the coil spring. According to this invention, even if the coil spring is compressed, the center axis of the coil spring does not largely change, so that a contact position between the insulation ball and the coil spring does not change. Accordingly, while a current does not flow in the coil spring, a current can be made to reliably flow from the plunger pin to the main body case. As a result, a relatively large current can be made to flow in the contact terminal.

In the above-described invention, a bottom surface of the second sac hole may be a conic surface. According to this invention, while a position of the end portion of the coil spring is stabilized, the insulation ball can be pressed by the coil spring. Accordingly, while a current does not flow in the coil spring, a current can be made to reliably flow from the plunger pin to the main body case. As a result, a relatively large current can be made to flow in the contact terminal.

In the above-described invention, the cut space may be a sac hole. According to this invention, the insulation ball is received in the sac hole so that a position of the insulation ball can be stabilized. Accordingly, while a current does not flow in the coil spring, a current can be made to reliably flow from the plunger pin to the main body case. As a result, a relatively large current can be made to flow in the contact terminal.

In the above-described invention, a bottom surface of the sac hole as the cut space may be a conic surface. According to this invention, the insulation ball can be stably positioned on the center axis of the conic surface. Accordingly, while a current does not flow in the coil spring, a current can be made to reliably flow from the plunger pin to the main body case. As a result, a relatively large current can be made to flow in the contact terminal.

In the above-described invention, a center axis of the conic surface of the sac hole as the cut space may be shifted from a center axis of the plunger pin. According to this invention, the outer surface of the large diameter portion of the plunger pin can be more strongly pressed on the inner surface of the main body case. Accordingly, a current can be made to reliably flow from the plunger pin to the main body case. As a result, a relatively large current can be made to flow in the contact terminal.

In the above-described invention, the cut space may include a bottom plane surface formed by cutting from an outer surface of the large diameter portion so as to extend in a direction crossing a center axis of the plunger pin, a side plane surface formed by cutting at a position shifted from the center axis of the plunger pin so as to extend in parallel with the center axis from the end of the large diameter portion to the bottom plane surface, and a groove portion in which a groove is formed in the side plane surface and in parallel with the center axis of the plunger pin, a normal line of the bottom plane surface and a normal line of the side plane surface may be positioned on a plane including the center axis of the plunger pin, and the bottom plane surface may extend in a direction of separating from the side plane surface so as to be inclined in a direction of separating from the end of the large diameter portion. According to this invention, a position of the insulation ball is moved such that the outer surface of the large diameter portion of the plunger pin is pressed on the inner surface of the main body case. Accordingly, while a current does not flow in the coil spring, a current can be made to reliably flow from the plunger pin to the main body case. As a result, a relatively large current can be made to flow in the contact terminal.

In the above-described invention, an inner surface of the groove portion may have a gutter-shape. According to this invention, a position of the insulation ball relative to the plunger pin is stabilized. Accordingly, while a current does not flow in the coil spring, a current can be made to reliably flow from the plunger pin to the main body case. As a result, a relatively large current can be made to flow in the contact terminal.

In the above-described invention, the gutter shape of the inner surface may have an imaginary radius smaller than a radius of the insulation ball. According to this invention, a position of the insulation ball relative to the plunger pin is more stabilized. Accordingly, while a current does not flow in the coil spring, a current can be made to reliably flow from the plunger pin to the main body case. As a result, a relatively large current can be made to flow in the contact terminal.

DESCRIPTION OF THE PREFERRED EMBODIMENTS

Embodiment 1

A contact terminal according to one embodiment of the present invention will be described in detail with reference to FIGS. 1 to 4.

Figure 1:
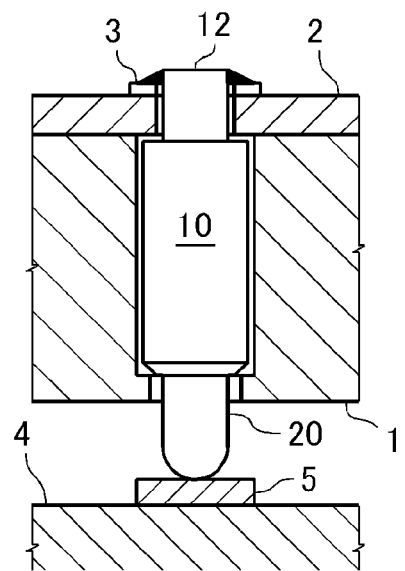
FIG. 1 is a sectional view in a state where a contact terminal according to an embodiment of the present invention is received in a socket.

As illustrated in FIG. 1, a contact terminal 10 is received by a socket 1 such that a pin part 12 and a plunger pin 20 of the contact terminal 10 protrude from both main surfaces of the socket 1, respectively. The socket 1 is a plate-shaped block body that is made of an insulation material such as resin and in which a penetration hole is formed. For example, the pin part 12 is inserted into a penetration hole of a printed circuit board 2 installed on one of the main surfaces of the socket 1 to be electrically connected to a circuit terminal 3 on the printed circuit board 2 by solder. A tip end part of the plunger pin 20 is contacted with a target part to which electrical connection is to be made. The target part is an electrode 5 arranged on an electrode block 4, for example. Thus, the contact terminal 10 is used for making connection to a power source. Further, a plurality of contact terminals 10 may be arranged in predetermined positions in another socket or other sockets not illustrated in the drawings to be electrically connected to an electronic component such as a printed circuit board and a semiconductor component. Thus, a plurality of contact terminals 10 may be used also as a contact probe in inspection of the electronic component.

Figure 2:
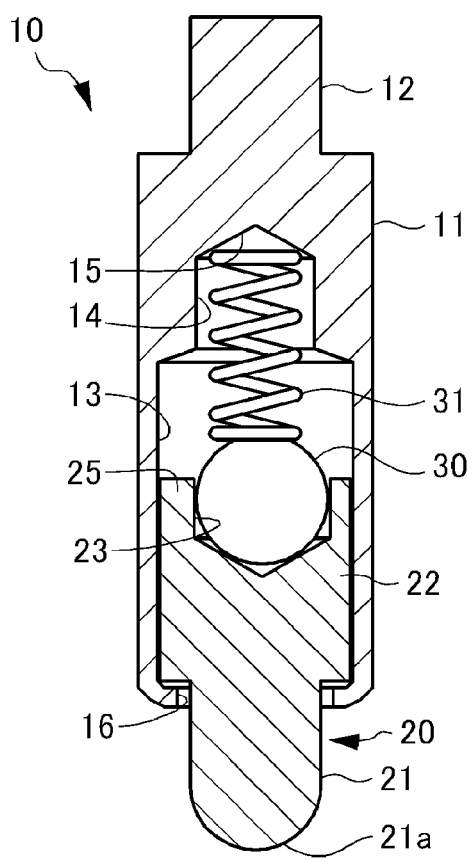
FIG. 2 is a sectional view of the contact terminal according to the embodiment of the present invention.
Figure 3:
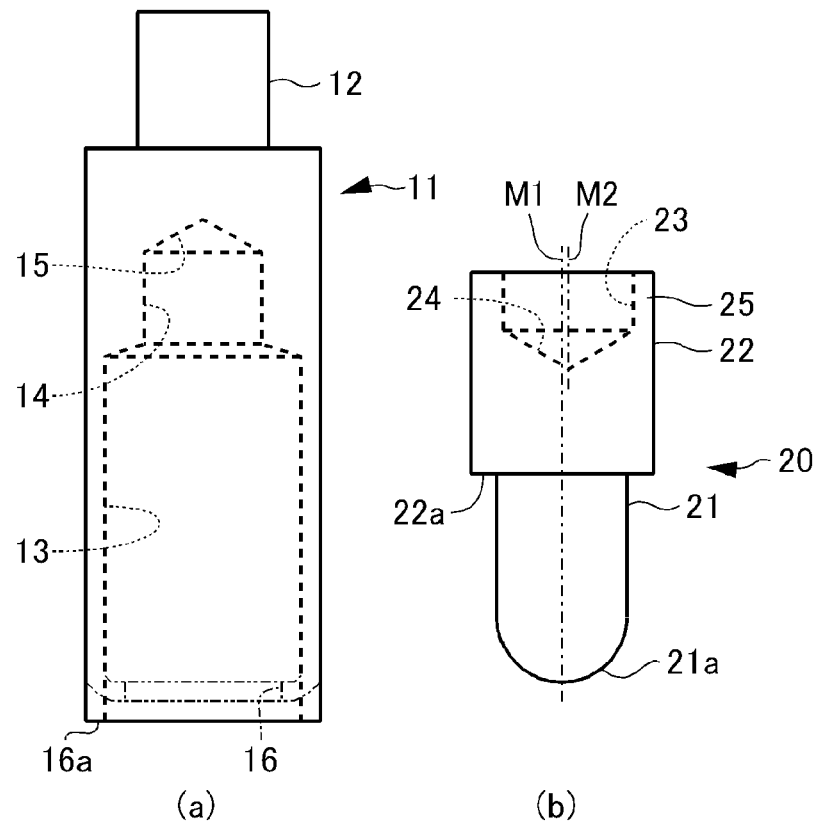
FIGS. 3A and 3B illustrate components of a main part of the contact terminal according to the embodiment of the present invention.

Referring to both of FIGS. 2 and 3, the contact terminal 10 includes the approximately column-shaped main body case 11 made of conductive metal such as brass, and the plunger pin 20 that is received in an elongate hole 13 formed by cutting the main body case 11 along a center axis of the main body case 11. The main body case 11 includes the approximately column-shaped pin part 12. The pin part 12 is positioned at an end portion of the elongate hole 13 opposite to an opening end portion 16 of the elongate hole 13. The pin part 12 protrudes from the main body case 11 in the axial direction. The elongate hole 13 includes a spring receiving hole 14 at the bottom portion of the hole 13. The spring receiving hole 14 is sac-like and approximately column-shaped pit hole. The elongate hole 13 includes an oblique surface 15 which is approximately cone surface-shaped at the bottom of the spring receiving hole 14.

The plunger pin 20 received in the elongate hole 13 has a round-bar shape, and includes a step. The plunger pin 20 includes a pin portion 21 that forms a small diameter portion of the pin 20, a large diameter portion 22, and a step portion 22a that is a boundary portion between the pin portion 21 and the large diameter portion 22. In one example, the pin portion 21 includes an approximately hemisphere tip end portion 21a. However, a shape of the pin portion 21 is not limited to this example. The large diameter portion 22 can move while the large diameter portion 22 contacts with an inner surface of the elongate hole 13 of the main body case 11. In other words, the large diameter portion 22 can freely slide relative to the elongate hole 13 to enable the plunger pin 20 to freely move along the center axis of the main body case 11. The large diameter portion 22 includes a sac-like and approximately column-shaped pit hole 23. The pit hole 23 is formed by cutting the large diameter portion 22 from the end thereof along the center axis. In other words, a cut portion is provided in the large diameter portion 22 so as to leave a side circumferential portion 25 that is a part of the large diameter portion 22 and that defines the pit hole 23. The large diameter portion 22 includes an approximately cone surface-shaped oblique surface 24 at the bottom of the pit hole 23 (particularly, refer to FIG. 3B).

In the pit hole 23, an insulation ball 30 made of an insulator such as ceramics is received. The insulation ball 30 may be made of metal or the like having a conductive property and coated with an insulation film. A diameter of the insulation ball 30 is also smaller than an inner diameter of the pit hole 23 so that the insulation ball 30 can be received in the pit hole 23. The diameter of the insulation ball 30 is larger than a diameter of the spring receiving hole 14 of the main body case 11. In other words, the spring receiving hole 14 of the main body case 11 is formed by cutting so as to have an inner diameter smaller than the diameter of the insulation ball 30. Accordingly, the spring receiving hole 14 does not receive the insulation ball 30 in the inside thereof.

Against the insulation ball 30, one end portion of a coil spring 31 which is a compression spring is contacted. The other end portion of the coil spring 31 is contacted against the oblique surface 15 of the spring receiving hole 14. A part of the coil spring 31 at and near the other end portion of the coil spring 31 is received in the spring receiving hole 14. The coil spring 31 is supported by the oblique surface 15 of the spring receiving hole 14 to press the plunger pin 20 via the insulation ball 30 in a direction of urging the plunger pin 20 to protrude from the main body case 11. The opening end portion 16 of the main body case 11 is narrowed to have an inner diameter smaller than the large diameter portion 22 of the plunger pin 20. The opening end portion 16 contacts against the step portion 22a of the plunger pin 20 to hold the large diameter portion 22 in the elongate hole 13. An insulator film may be provided on the coil spring 31.

Figure 4:
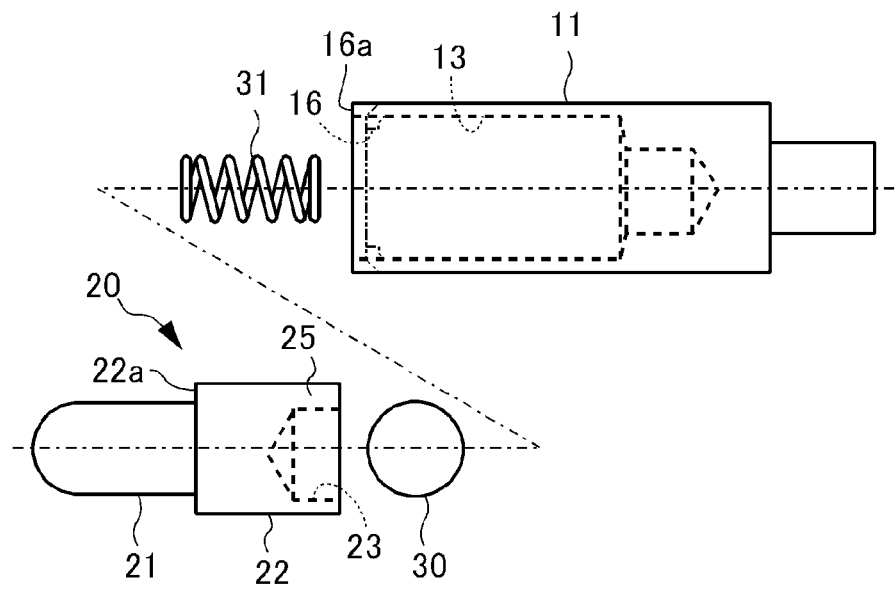
FIG. 4 illustrates assembling of the contact terminal according to the embodiment of the present invention.

In other words, as illustrated in FIG. 4, when the contact terminal 10 is assembled, first, the insulation ball 30 is received in the pit hole 23 of the plunger pin 20, and a part of the coil spring 31 at and near one end portion of the coil spring 31 is received in the spring receiving hole 14 of the main body case 11. Next, against the other end portion of the coil spring 31, the insulation ball 30 is pressed to compress the coil spring 31, and at the same time, a part of the plunger pin 20 on the side of the large diameter portion 22 is received in the elongate hole 13 of the main body case 11. Further, a process of narrowing a diameter of the opening end portion 16a of the main body case 11 is performed to form the opening end portion 16. An inner diameter of the opening end portion 16 is smaller than an outer diameter of the large diameter portion 22, and larger than an outer diameter of the pin portion 21. Accordingly, the plunger pin 20 is prevented from falling out of the main body case 11. As a result, the plunger pin 20 can obtain a stroke from a position where the step portion 22a is contacted against the opening end portion 16 to a position where the insulation ball 30 is contacted against the opening portion of the spring receiving hole 14 or to a position where the coil spring 31 is fully compressed.

According to the present embodiment, an outer diameter of the coil spring 31 is set to be smaller than the inner diameter of the spring receiving hole 14 as understood from the coil spring 31 received in the coil receiving hole 14. In other words, the insulation ball 30 has the outer diameter larger than an inner diameter of the coil spring 31, so that the insulation ball 30 does not enter an inside of the coil spring 31. Accordingly, if the coil spring 31 is provided with an insulation film, and this film falls off, the intervening insulation ball 30 securely prevents the coil spring 31 from contacting with the plunger pin 20. Thereby, the coil spring 31 can be securely insulated from the plunger pin 20. In other words, if a relatively large current flows in the plunger pin 20, it is possible to securely prevent the coil spring 31 from being burned out.

The coil spring 31 is a compression spring. A position of one of the end portions of the coil spring 31 is stabilized by the insulation ball 30. Meanwhile, when the coil spring 31 is compressed from both end portions thereof, the center axis of the coil spring 31 is slightly warped. Accordingly, the plunger pin 20 is pressed via the insulation ball 30 by the coil spring 31 in a direction that makes a minute angle with the center axis of the main body case 11. Thereby, the large diameter portion 22 of the plunger pin 20 is securely contacted with the inner surface of the elongate hole 13, and at this time, the contact pressure is not excessively raised. Since the insulation ball 30 is received in the pit hole 23, the plunger pin 20 includes the side circumferential portion 25 formed by extending the large diameter portion 22 in the axial direction on the outer circumferential side of the pit hole 23. Thereby, the plunger pin 20 has an increased surface area. As a result, it is possible to enable the large diameter portion 22 to more securely contact with the inner surface of the elongate hole 13. In other words, if a relatively large current flows in the plunger pin 20, a current can securely flow from the plunger pin 20 to the main body case 11.

In addition, the insulation ball 30 is received in the pit hole 23, so that the insulation ball 30 does not contact with the inner surface of the elongate hole 13 of the main body case 11, and does not slide against the inner surface of the elongate hole 13. Further, the insulation ball 30 contacts with the inner surface of the pit hole 23. However, the insulation ball 30 can only slightly slide or rotate in the pit hole 23. For example, even when the insulation ball 30 is made of a substance having higher hardness compared with the plunger pin 20, it is possible to inhibit abrasion powder or the like due to sliding or rotating of the insulation ball 30 from being generated from the pit hole 23. Thereby, a sliding defect of the plunger pin 20 due to the abrasion powder can be prevented.

Further, a part of the coil spring 31 at and near one end portion of the coil spring 31 is received in the spring receiving hole 14 of the main body case 11. Accordingly, when compression force is increased to be high to compress the coil spring 31, the respective portions of the coil spring 31 are successively received in the spring receiving hole 14. In other words, even when the coil spring 31 is compressed, and increases force of pressing the plunger pin 20 to be large, the warping of the center axis of the coil spring 31 is not excessively increased. Accordingly, a contact position between the coil spring 31 and the insulation ball 30 is not largely shifted, so that the coil spring 31 does not contact the plunger pin 30.

Furthermore, at the bottom of the spring receiving hole 14, the approximately cone surface-shaped oblique surface 15 is formed. Accordingly, when compression force of the coil spring 31 is large, a center position of the end portion of the coil spring 31 tends to correspond to a center position of the oblique surface 15. When compression force of the coil spring 31 is small, the center position of the end portion of the coil spring 31 tends to be shifted from the center position of the oblique surface 15. In other words, when compression force of the coil spring 31 is large, a direction of pressing the plunger pin 20 tends to make a small angle with the center axis of the main body case 11, and when compression force of the coil spring 31 is small, a direction of pressing the plunger pin 20 tends to make a large angle with the center axis of the main body case 11. Thereby, more easily, the plunger pin 20 can be securely contacted with the main body case 11 without excessively raising the contact pressure.

Further, at the bottom of the pit hole 23 of the plunger pin 20, the approximately cone surface-shaped oblique surface 24 is formed. Accordingly, the center of the insulation ball 30 can be reliably positioned on the center axis of the oblique surface 24. Thereby, a contact position between the coil spring 31 and the insulation ball 30 can be stabilized so that the coil spring 31 can be reliably insulated. In addition, a position of the insulation ball 30 relative to the pit hole 23 is stabilized, and thereby, the above-described minute sliding or rotating of the insulation ball 30 is more decreased so that generation of the abrasion powder can be inhibited.

Preferably, the center axis of the oblique surface 24 is shifted from the center axis of the plunger pin 20. In the present embodiment, as illustrated in FIG. 3B, the center axis M2 of the oblique surface 24 and the center axis of the pit hole 23 are shifted from the center axis M1 of the plunger pin 20. Thereby, a direction of pressing the plunger pin 20 by the coil spring 31 reliably makes a minute angle with the center axis of the plunger pin 20. For this reason, the large diameter portion 22 can be pressed against the inner surface of the elongate hole 13 by force that does not prevent sliding between the plunger pin 20 and the main body case 11. In other words, a current can more reliably flow from the plunger pin 20 to the main body case 11.

In the present embodiment, the pin portion 12 is molded integrally with the main body 11. The pin portion 12 may be a plunger pin like the plunger pin 20. A shape of a tip end portion of the pin portion 12, and a shape of the tip end portion 21a of the pin portion 21 may be shapes other than the above-described shapes, in accordance with a contact target part.

Embodiment 2

Figure 5:
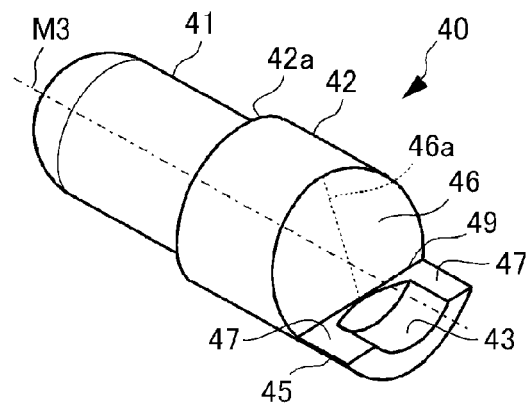
FIG. 5 illustrates components of a main part of another contact terminal according to an embodiment of the present invention.
Figure 6:
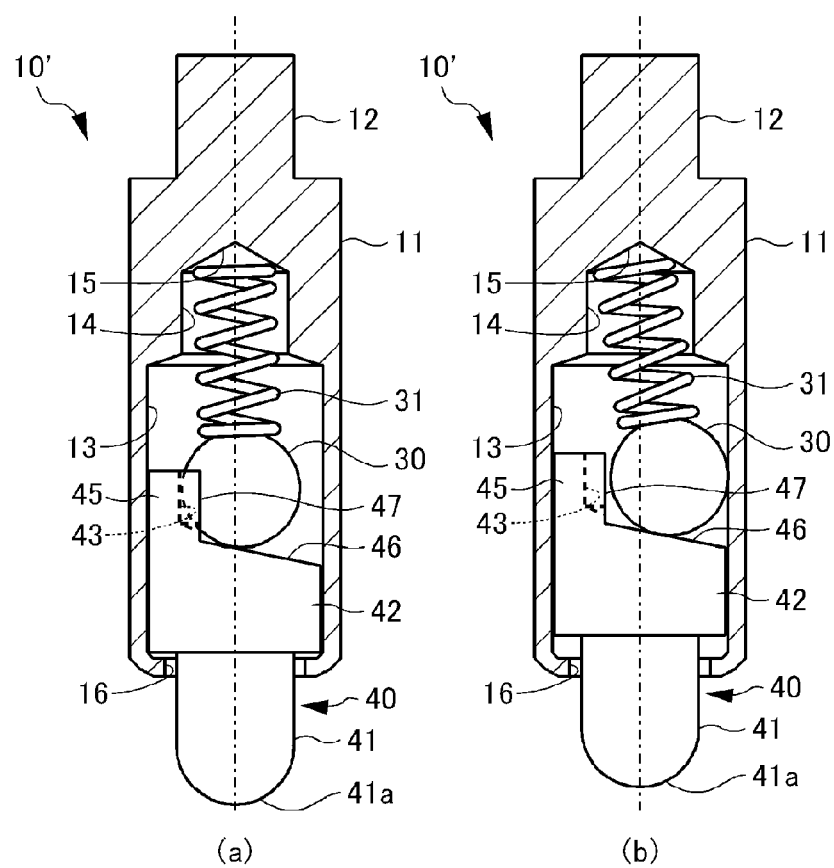
FIGS. 6A and 6B are sectional views of another contact terminal according to the embodiment of the present invention.

With reference to FIGS. 5 and 6, a contact terminal according to another embodiment of the present invention will be described.

As illustrated in FIG. 5, in the contact terminal 10', a shape of a plunger pin 40 is different from the shape in the contact terminal 10 according to the embodiment 1. Meanwhile, since other components, i.e., the main body case 11, the insulation ball 30 and the coil spring 31 of the contact terminal 10' are the same as those of the contact terminal 10 according to the embodiment 1, description of these components will be omitted.

Referring to both of FIGS. 5 and 6, the plunger pin 40 received in the elongate hole 13 has a round-bar shape, and includes a step. The plunger pin 40 includes a small diameter portion and a large diameter portion. The plunger pin 40 includes a pin portion 41 as the small diameter portion, the large diameter portion 42 as a main body, and a step portion 42a between the pin portion 41 and the large diameter portion 42. In one example, the pin portion 41 includes an approximately hemisphere tip end portion 41a. However, a shape of the pin portion 41 is not limited to this example. The large diameter portion 42 can move while the large diameter portion 42 contacts with the inner surface of the elongate hole 13 of the main body case 11. In other words, the large diameter portion 42 can freely slide relative to the elongate hole 13 to enable the plunger pin 40 to freely move along the center axis of the main body case 11. An opening end portion 16 of the main body case 11 is narrowed so as to have an inner diameter smaller than the large diameter portion 42 of the plunger pin 40. The opening end portion 16 contacts against the step portion 42a to hold the large diameter portion 42 in the elongate hole 13.

Particularly, referring to FIG. 5, in the large diameter portion 42, a sac-like and approximately-column-shaped hole is formed by cutting from an end portion of the large diameter portion 42 along the center axis M3. Then, a plane surface is formed at a position shifted from the center axis M3 by cutting such that a part of the inner surface of this hole remains to form a shape of a gutter. Further, a bottom plane surface 46 is formed by cutting so as to intersect with the above-mentioned plane surface formed by cutting, and so as to cross the center axis M3. As a result, the large diameter portion 42 is provided with the side plane surface 47 of which position is shifted from the center axis M3 and that is approximately parallel with the center axis M3. In addition, in this side plane surface 47, the groove portion 43 is formed. The large diameter portion 42 may be formed by other appropriate methods, as long as the large diameter portion 42 is made to have the above-described shape.

More specifically, a side circumferential portion 45 is formed by leaving the large diameter portion 42 by an outer circumferential length smaller than the semicircle length. The side circumferential portion 45 makes a pair with the side plane surface 47. The bottom plane surface 46 extends in a direction of separating from the side circumferential portion 45 so as to be inclined in a direction of separating from the end of the large diameter portion 42. The normal line of the bottom plane surface 46 is included in the plane that includes the center axis M3 and the normal line of the side plane surface 47. In other words, when the center axis M3 is directed in the vertical direction, the maximum inclined line 46a of the bottom plane surface 46 is approximately perpendicular to the an intersecting line 49 between the bottom plane surface 46 and the side plane surface 47. Further, preferably, when the center axis M3 is directed in the vertical direction in a state where the tip portion 41a of the plunger pin 40 is positioned on the lower side, the top position of the side circumferential portion 45 is higher than the center position of the insulation ball 30 that contacts with both of the side circumferential portion 45 and the bottom plane surface 46.

The insulation ball 30 is received in a cut space sandwiched between the side circumferential portion 45 and the bottom plane surface 46 of the plunger pin 40. When the plunger pin 40 is moved along the elongate hole 13 of the main body case 11, pressing force to the insulation ball 30 is changed in accordance with change in compression force of the coil spring 31. At this time, the insulation ball 30 can move in a radial direction of the elongate hole 13 of the main body case 11. This movement range is restricted to stay between a position shown in FIG. 6A where the insulation ball 30 contacts with the side circumferential portion 45 and a position shown in FIG. 6B where the insulation ball 30 contacts with the inner surface of the elongate hole 13 of the main body case 11.

By the pressing force from the coil spring 31, and the inclination of the bottom plane surface 46, the insulation ball 30 can be stably positioned to be separated from the side circumferential portion 45, i.e., stably positioned at a position that approaches the inner surface of the elongate hole 13. The movement of the insulation ball 30 urges the plunger pin 40 to the side of the side circumferential portion 45, causing the side surface of the large diameter portion 42 to reliably contact against the inner surface of the elongate hole 13. This contact area includes the side surface of the side circumferential portion 45 that is elongated in a direction along the center axis M3, and this side surface is a part of the side surface of the large diameter portion 42. Accordingly, the contact area between the large diameter portion 42 and the inner surface of the elongate hole 13 can be increased. In other words, even when a relatively large current is made to flow in the plunger pin 40, the current can reliably flow from the plunger pin 40 to the main body case 11. In the present embodiment, contact pressure of the plunger pin 40 to the inner surface of the elongate hole 13 can be made large compared with the contact pressure in the case of the embodiment 1.

The gutter-shaped groove portion 43 inhibits the insulation ball 30 from moving in the direction approximately perpendicular to the center axis M3 and in parallel with the side plane surface 47. Thereby, a position of the insulation ball 30 relative to the plunger pin 40 can be more stabilized, and the plunger pin 40 can more stably contact against the inner surface of the elongate hole 13. A shape of a section of the groove portion 43 in the direction perpendicular to the longitudinal direction of the groove portion 43 is a part of an imaginary circle. A diameter of the insulation ball 30 can be set to be larger than a diameter of the imaginary circle so that two points of edges of the groove portion 43 can sandwich the insulation ball 30 that contacts against the side circumferential portion 45, to support the insulation ball 30. Thereby, a position of the insulation ball 30 can be more stabilized.

The embodiments of the present invention and the altered examples based on the embodiments are described above. However, the present invention is not necessarily limited to these examples. A person skilled in the art would find various alternative embodiments and modified examples without departing from the gist of the present invention and the scope of the attached claims.

What is claimed is:

1. A contact terminal for providing an electrical connection by contacting a protrusion end portion of a plunger pin protruding from a main body case having an elongate hole with a target portion, the contact terminal comprising the main body case and the plunger pin, wherein said plunger pin received in said elongate hole of said main body case comprises a round bar with a step, having a small diameter portion including said protrusion end portion and a large diameter portion being able to slide on an inner surface of said elongate hole of said main body case to freely move in a longitudinal direction thereof; and said plunger pin is pressed by a coil spring received in said main body case to protrude said protrusion end portion of said plunger pin from said main body case, and said coil spring presses a ball face of a press member to an oblique pit portion having a cone surface-shape on said large diameter portion, said ball face contacting the oblique pit portion in at least two locations and a center axis of said oblique pit portion is sifted from a center axis of said plunger pin to press an outer surface of said large diameter portion onto said inner surface of said elongate hole of said main body case.

2. The contact terminal according to claim 1, wherein said press member comprises an insulation ball including an insulation surface.

3. A contact terminal comprising:
a main body case having an elongated hole formed at one end thereof;
a plunger pin have a protrusion portion protruding through said one end of the main body case, the plunger pin being formed of a round bar with a step such that the protrusion portion has a small diameter portion the protrudes through said end of the main body and a large diameter portion configured to slide freely on an inner surface of the elongated hole, the small diameter portion being separated from the large diameter portion by said step, the large diameter portion including an oblique pit portion having a center axis that is offset from a center axis of the large diameter portion;
a press member having a portion received in the oblique pit portion, a portion of said press member having a curved surface; and
a coil spring located between the press member and an end of the hole opposite said one end of the main body case, the coil spring configured to press said curved surface into the oblique pit portion such that the curved surface contacts the oblique pit portion in at least two locations.

4. The contact terminal according claim 3, wherein an outer extent of the press member is greater than a diameter of the coil spring.

5. The contact terminal according to claim 3, where said press member is a ball.

6. The contact terminal according to claim 3, wherein the large diameter portion of the plunger pin includes a cylindrical hole between the oblique pit portion and an end of the plunger pin opposite the small diameter portion.

* * * * *